US009595447B2

(12) United States Patent
Inada et al.

(10) Patent No.: US 9,595,447 B2
(45) Date of Patent: Mar. 14, 2017

(54) DETECTION APPARATUS, IMPRINT APPARATUS, AND METHOD OF MANUFACTURING PRODUCTS

(71) Applicant: CANON KABUSHIKI KAISHA, Tokyo (JP)

(72) Inventors: Hiroshi Inada, Utsunomiya (JP); Kazuhiko Mishima, Utsunomiya (JP); Takafumi Miyaharu, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/621,238

(22) Filed: Feb. 12, 2015

(65) Prior Publication Data

US 2015/0235880 A1    Aug. 20, 2015

(30) Foreign Application Priority Data

Feb. 18, 2014  (JP) ................. 2014-028867

(51) Int. Cl.
*G06K 9/00* (2006.01)
*H01L 21/304* (2006.01)
(Continued)

(52) U.S. Cl.
CPC .......... *H01L 21/304* (2013.01); *G03F 9/7038* (2013.01); *G03F 9/7076* (2013.01);
(Continued)

(58) Field of Classification Search
CPC ..... A61B 6/4291; A61B 6/563; A61B 6/5252; G01B 11/27; G01B 11/14; G01B 11/2755;
(Continued)

(56) References Cited

U.S. PATENT DOCUMENTS 3,614,237 A  *  10/1971  Kyle ................. G01B 11/254
                                                    356/2
5,019,701 A  *   5/1991  Yagoto ................. G02B 7/32
                                                    250/201.5
(Continued)

FOREIGN PATENT DOCUMENTS

JP    H06-307811 A    11/1994
JP    2006-259153 A    9/2006
(Continued)

*Primary Examiner* — Vu Le
*Assistant Examiner* — Aklilu Woldemariam
(74) *Attorney, Agent, or Firm* — Canon USA, Inc. I.P. Division

(57) ABSTRACT

This disclosure provides a detection apparatus configured to detect a moire pattern generated by grid patterns having grid pitches different from each other including: an image-pickup unit configured to pick up an image of the moire pattern; an imaging optical system configured to cause the image-pickup unit to image the moire pattern; and a processing unit configured to process an image-pickup result of the moire pattern imaged by the image-pickup unit, wherein a mark including a plurality of patterns having a width not larger than the resolving power of the imaging optical system arranged in a measuring direction and changed in duty ratio between the widths and intervals of the plurality of patterns is imaged by the image-pickup unit, and the processing unit evaluates the detection apparatus by processing the image-pickup result of the mark picked up by the image-pickup unit.

19 Claims, 4 Drawing Sheets

(51) Int. Cl.
*G03F 9/00* (2006.01)
*G06T 7/00* (2006.01)

(52) U.S. Cl.
CPC .............. *G06K 9/00* (2013.01); *G06T 7/0004* (2013.01); *G06T 2207/30148* (2013.01)

(58) Field of Classification Search
CPC .......... G01B 2210/143; G01B 2210/30; G01B 11/255; G03F 9/7038; G03F 9/7076; G03F 9/7042; G03F 9/7088; G03F 7/70241; G03F 7/70558; G03F 7/706; G03F 7/70633; G03F 7/70625; G03F 1/144; G03F 1/36; G03F 7/70125; G03F 7/70441; G03F 9/7003; G03F 7/0002; G06T 2207/30148; G06T 7/0004; G06T 7/003; G06T 7/0072; G06T 2207/10116; G06K 2209/07; G06K 9/32; G06K 7/1439; G06K 7/1452; G02B 6/0065; G02B 27/095; G02B 27/2214; G02B 5/0221; G02B 5/0278; G02B 5/045; G02B 6/0053; G01M 11/0242; G01M 11/025; G01M 11/0264; G06F 2203/04103; G01D 5/266; G01D 5/34715; G01D 5/34792; G01D 5/2455; F21V 9/14; G02F 1/133526; G03C 9/02; Y10S 128/922; B41F 33/0081; G01N 23/04; G09F 19/18; G11B 7/12; H04L 63/126; Y10T 428/1486
USPC .............. 382/151, 144, 199, 200, 263, 275; 250/394, 395

See application file for complete search history.

(56) References Cited

U.S. PATENT DOCUMENTS

| | | | | |
|---|---|---|---|---|
| 5,052,807 | A * | 10/1991 | Juday | G01D 5/38 356/399 |
| 6,763,145 | B1 * | 7/2004 | Street | G02B 27/2214 382/151 |
| 7,633,618 | B2 * | 12/2009 | Monshouwer | G01B 11/27 257/797 |
| 2006/0055627 | A1 * | 3/2006 | Wilson | G02B 5/0221 345/3.1 |
| 2006/0114450 | A1 * | 6/2006 | Nimmakayala | B82Y 10/00 356/139.04 |
| 2008/0094629 | A1 * | 4/2008 | Wu | G03F 9/7049 356/401 |
| 2011/0243300 | A1 * | 10/2011 | Kaneko | A61B 6/06 378/36 |
| 2011/0274252 | A1 * | 11/2011 | Kuwabara | A61B 6/4291 378/155 |
| 2012/0153181 | A1 * | 6/2012 | Iwakiri | A61B 6/4291 250/394 |
| 2012/0327354 | A1 * | 12/2012 | Yoshida | G02F 1/136286 349/143 |
| 2013/0221556 | A1 * | 8/2013 | Miyaharu | B29C 59/002 264/40.1 |
| 2014/0044234 | A1 * | 2/2014 | Hashimoto | A61B 6/4291 378/62 |

FOREIGN PATENT DOCUMENTS

| | | |
|---|---|---|
| JP | 2008-522412 A | 6/2008 |
| JP | 2010-267682 A | 11/2010 |
| KR | 10-2013-0098210 A | 9/2013 |
| TW | 201139118 A | 11/2011 |

* cited by examiner

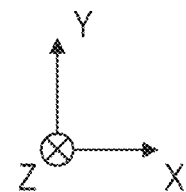

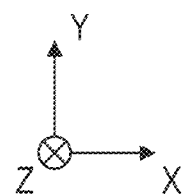

27

27

DETECTION APPARATUS, IMPRINT APPARATUS, AND METHOD OF MANUFACTURING PRODUCTS

BACKGROUND

Field of the Invention

This disclosure relates to a detection apparatus configured to detect a mark, an imprint apparatus provided with the detection apparatus configured to detect the mark, and a method of manufacturing products by using the detection apparatus and the imprint apparatus.

Description of the Related Art

An imprint technology is known as a technology for manufacturing semiconductor devices. The imprint technology is a technology for forming a pattern on an imprint material supplied onto a substrate by using a mold having a pattern formed thereon.

PCT Japanese Translation Patent Publication No. 2008-522412 discloses an imprint apparatus provided with a detection apparatus configured to detect an alignment mark formed in a shot area on a substrate and an alignment mark formed on a mold simultaneously. The detection apparatus disclosed in PCT Japanese Translation Patent Publication No. 2008-522412 includes the alignment marks formed on the mold and the substrate respectively and including grid patterns having grid pitches in a direction for measuring a relative position, and achieves die-by-die alignment between the mold and the substrate on the basis of a result of detection of phases of a moire pattern formed of both of the grid patterns.

In the detection apparatus, the both grid pitches of the grid pattern on the substrate and the grid pattern on the mold in the direction of measurement are slightly different from each other, and if the both grid patterns are overlapped each other, diffracted light from both grid patterns interferes with each other and generates a moire pattern having a cycle reflecting the grid pitch difference. When the relative position of the grid patterns changes in the measuring direction, the phase of the moire pattern changes as well. Therefore, alignment between the substrate and the mold is achieved by detecting the phase of the moire pattern.

In order to detect the moire pattern and achieve the alignment between the substrate and the mold, it is necessary to evaluate performances of the detection apparatus itself first. By actually using the cycle of the moire pattern obtained from the grid pitch difference between the respective grid patterns on the substrate and the mold and an image of a cycle of a moire pattern picked up by an image-pickup unit of the detection apparatus, an optical magnification (a magnification of an optical system) as one of optical performances of the detection apparatus may be evaluated.

The detection apparatus provided in the imprint apparatus of the PCT Japanese Translation Patent Publication No. 2008-522412 cannot detect the moire pattern unless the grid pattern formed on the substrate and the grid pattern formed on the mold overlap each other. Therefore, the performances of the detection apparatus cannot be evaluated without using the substrate and the mold having the grid patterns formed thereon.

SUMMARY

This disclosure provides a detection apparatus configured to detect a moire pattern generated by grid patterns having grid pitches different from each other comprising: an image-pickup unit configured to pick up an image of the moire pattern; an imaging optical system configured to form the image of the moire pattern on the image-pickup unit; and a processing unit configured to process an image-pickup result of the moire pattern picked up by the image-pickup unit, wherein the image pickup unit picks up an image of a mark including a plurality of patterns having a width not larger than a resolving power of the imaging optical system arranged in a measuring direction and changed in duty ratio between the widths and intervals of the plurality of patterns, and the processing unit evaluates the detection apparatus by processing the image-pickup result of the mark picked up by the image-pickup unit.

Another aspect of this disclosure provides a detection apparatus configured to detect a moire pattern generated by grid patterns having grid pitches different from each other comprising: an image-pickup unit configured to pick up an image of the moire pattern; an imaging optical system configured to cause the image-pickup unit to image the image of the moire pattern; and a processing unit configured to process an image-pickup result of the moire pattern picked up by the image-pickup unit, wherein the image pickup unit picks up an image of a mark including a plurality of patterns having a width not larger than the resolving power of the imaging optical system arranged in a measuring direction and changed in length in a non-measuring direction of the plurality of patterns is imaged, and the processing unit evaluates the detection apparatus by processing the image-pickup result of the mark picked up by the image-pickup unit.

Further features of the present invention will become apparent from the following description of exemplary embodiments with reference to the attached drawings.

DESCRIPTION OF THE EMBODIMENTS

Figure 1:
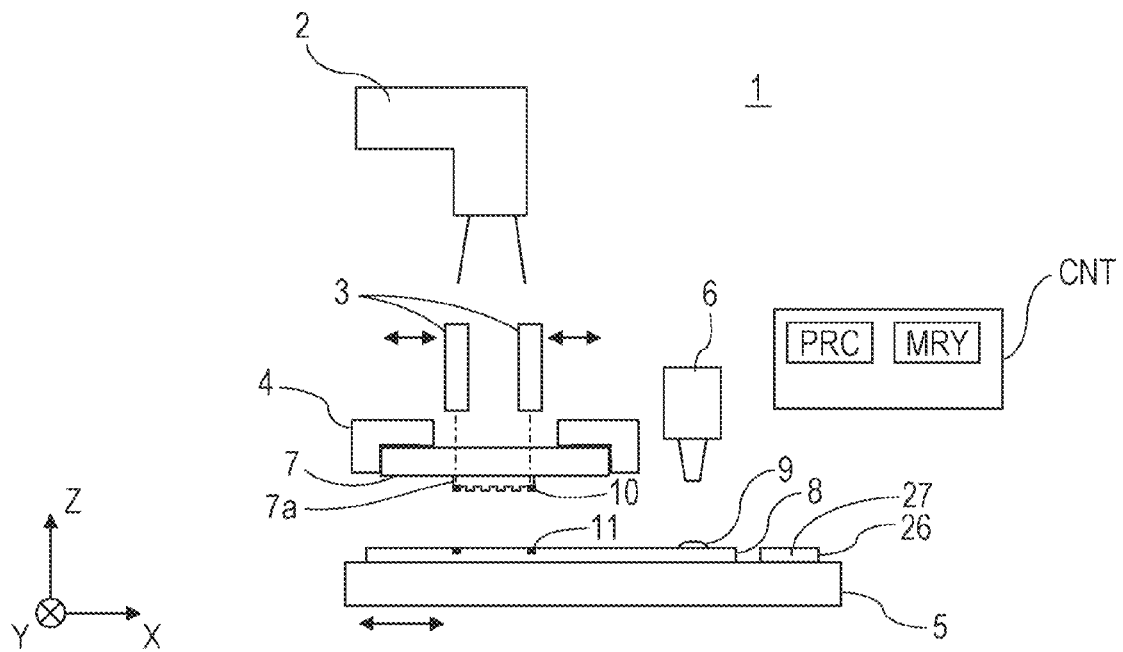
FIG. 1 is a drawing illustrating an imprint apparatus of a first embodiment.

Preferred embodiments of this disclosure will be described below with reference to the attached drawings in detail. In the respective drawings, the same members are denoted by the same reference numerals and overlapped description is omitted.

First Embodiment

Imprint Apparatus

An imprint apparatus 1 of a first embodiment will be described with reference to FIG. 1. Here, an imprint method employing a light curing method for curing an imprint material by an irradiation of light will be described. An imprint method using a UV cured resin as the imprint material and a UV beam as the light will also be described. In the imprint apparatus 1 using the light curing method, an imprint material 9 (light cured resin, UV cured resin) is supplied to a shot area, which is an imprint area on a substrate 8 (wafer) formed of silicon wafer. The imprint material 9 supplied onto the substrate 8 is molded by a mold (template, original plate), and the imprint material 9 is cured to form a pattern on the substrate 8. In the following description, as illustrated in FIG. 1, a direction in which the mold 7 is pressed against the substrate 8 is defined as a Z axis, and an X axis and a Y axis lay orthogonally to each other in a plane orthogonal to the Z axis and parallel to a surface of the substrate 8.

The imprint apparatus 1 in FIG. 1 includes an irradiating portion 2, a detection apparatus 3, a mold retaining portion 4, a substrate stage 5, and an application unit 6.

The irradiating portion 2 irradiates a UV beam after the mold 7 and the imprint material 9 on the substrate 8 have been brought into contact with each other (imprint) to cause the imprint material 9 to be cured. The irradiating portion 2 may include not only a light source (not illustrated), but also an optical element configured to illuminate the mold 7 with a UV beam emitted from the light source in a predetermined irradiation area uniformly. Examples of the light source which may be used here include a high-pressure mercury lamp, various types of excimer lamps, excimer lasers, or light-emitting diodes. The light source is selected as needed in accordance with characteristics of the imprint material 9. However, this disclosure is not limited by the type, the number, or the wavelength of the light source. The mold 7 is provided with a concavo-convex pattern on the surface opposing the substrate 8, and is formed of a material which allows the UV beam from the irradiating portion 2 to pass therethrough (quartz, for example).

The mold retaining portion 4 (imprint head) is a mechanism configured to retain the mold 7. The mold retaining portion attracts and retains the mold 7 by a vacuum adsorption force or an electrostatic force, for example. The mold retaining portion 4 includes a mold chuck, a drive mechanism configured to drive the mold chuck in a Z direction for bringing the mold 7 into contact with (pressing against) the imprint material 9, and a correcting mechanism configured to deform the mold 7 in an X direction and a Y direction. By deforming the mold 7 by the correcting mechanism, a patterned surface 7a may be aligned with the shot area on the substrate.

The mold 7 and the substrate 8 constitute a first substance and a second substance arranged at a distance in the Z direction. The actions of imprinting and separating in the imprint apparatus 1 may be achieved by moving the mold 7 in the Z direction, and, for example, may be achieved by moving the substrate stage 5 in the Z direction. In addition, both of the mold 7 and the substrate 8 may be moved simultaneously or in sequence. The substrate stage 5 is a mechanism configured to retain the substrate 8. The substrate stage 5 retains the substrate 8 by vacuum adsorption, for example, and is movable in an XY plane.

The imprint apparatus 1 is provided with the detection apparatus 3 configured to detect alignment marks formed on the mold 7 and the substrate 8. The imprint apparatus 1 is capable of obtaining a relative position between the mold 7 and the substrate 8 by using a result of detection of the detection apparatus 3. The detection apparatus 3 detects a mark 10 (including a first mark and a third mark) formed on the mold 7 and a mark 11 (including a second mark and a fourth mark) formed on the substrate 8 optically and obtains the relative position between the mold and the substrate.

An optical axis of the detection apparatus 3 of the first embodiment is arranged so as to be perpendicular to the surface of the substrate 8. The detection apparatus 3 is configured to be driven in the X direction and the Y direction so as to be aligned with positions of the mark 10 formed on the mold 7 and of the mark 11 formed on the substrate 8. In addition, the detection apparatus 3 is configured to be driven also in the Z direction so as to focus a detection optical system (imaging optical system) of the detection apparatus on the positions of the mark 10 and the mark 11.

The imprint apparatus 1 performs alignment of the mold 7 and the substrate 8. The alignment is achieved by controlling driving of correcting mechanisms (drive mechanisms) of the substrate stage 5 and the mold 7 on the basis of the relative position between the mold 7 and the substrate 8 obtained from the result of detection of the alignment marks detected by the detection apparatus 3.

The application unit 6 (dispenser) is provided in an interior of the imprint apparatus 1 as illustrated in FIG. 1, and is configured to apply (supply) the imprint material 9 in an uncured state on the substrate 8. In contrast, a configuration in which the application unit 6 is not installed in the interior of the imprint apparatus 1, the application unit is prepared outside the imprint apparatus 1, and the substrate 8 on which the imprint material 9 is applied outside the imprint apparatus 1 in advance is introduced into the interior of the imprint apparatus 1 is also applicable. In this configuration, an application process in the interior of the imprint apparatus 1 is eliminated, and hence the process to be performed by the imprint apparatus 1 may be made quicker.

Imprint Process

Subsequently, the imprint process (imprint cycle) to be performed by the imprint apparatus 1 will be described. The imprint process descried below is achieved by executing a program stored in a memory MRY having a control unit CNT (processing unit) illustrated in FIG. 1. The processor PRC provided in the control unit CNT is configured to process the program stored in the memory MRY. In this manner, the action of the imprint process of this disclosure is executed in accordance with a program stored in the memory MRY of the control unit CNT.

The control unit CNT conveys the substrate 8 loaded into the interior of the imprint apparatus 1 to the substrate stage 5 by a substrate conveying unit, which is not illustrated, and fixes the substrate 8 on the substrate stage 5. Subsequently, the control unit CNT moves the substrate stage 5 to a position of application of the application unit 6. Subsequently, the application unit 6 applies the imprint material 9 in the predetermined shot area on the substrate 8 as the application process. Subsequently, the control unit CNT moves the substrate stage 5 so that the shot area on the substrate 8 on which the imprint material 9 is supplied is located immediately under the mold 7.

Subsequently, the control unit CNT drives the mold retaining portion 4 by the drive mechanism, which is not illustrated, to bring the imprint material 9 on the substrate 8 and the mold 7 into contact with each other (imprinting process). At this time, the imprint material 9 flows along a pattern formed on the patterned surface 7a of the mold 7 by contact with the mold 7 (filling process). Furthermore, in a state in which the mold 7 and the imprint material 9 are in contact with each other, the detection apparatus 3 detects the mark 10 of the mold 7 and the mark 11 of the substrate 8. The control unit CNT aligns the relative position between the mold 7 and the substrate 8 by obtaining the relative position between the mold 7 and the substrate 8 from the result of detection of the detection apparatus 3 and driving the substrate stage 5. The control unit CNT corrects the patterned surface 7a of the mold 7 by driving the correcting mechanism of the mold retaining portion 4.

In a stage in which a flow of the imprint material 9 to the patterned surface 7a (filling of the imprint material into a pattern depression) is sufficiently done, the irradiating portion 2 irradiates the mold 7 with a UV beam from a back surface (an upper surface, a surface opposite from the patterned surface 7a). In addition, the irradiating portion 2 may be configured to irradiate the imprint material 9 with a UV beam in a stage in which the alignment of the mold 7 and the substrate 8 and the correction of the mold 7 are sufficiently done. The imprint material 9 is cured by the UV beam passed through the mold 7 (curing process). When irradiating with the UV beam, the control unit CNT drives to retract the detection apparatus 3 so as not to block an optical path of the irradiating portion 2. After the imprint material is cured, the control unit CNT drives the mold retaining portion 4, and widens the interval between the mold 7 and the substrate 8 (separating process), so that a concavity and convexity pattern of the mold 7 is transferred to the imprint material 9 on the substrate 8.

Detection Apparatus and Alignment Mark

Figure 2:
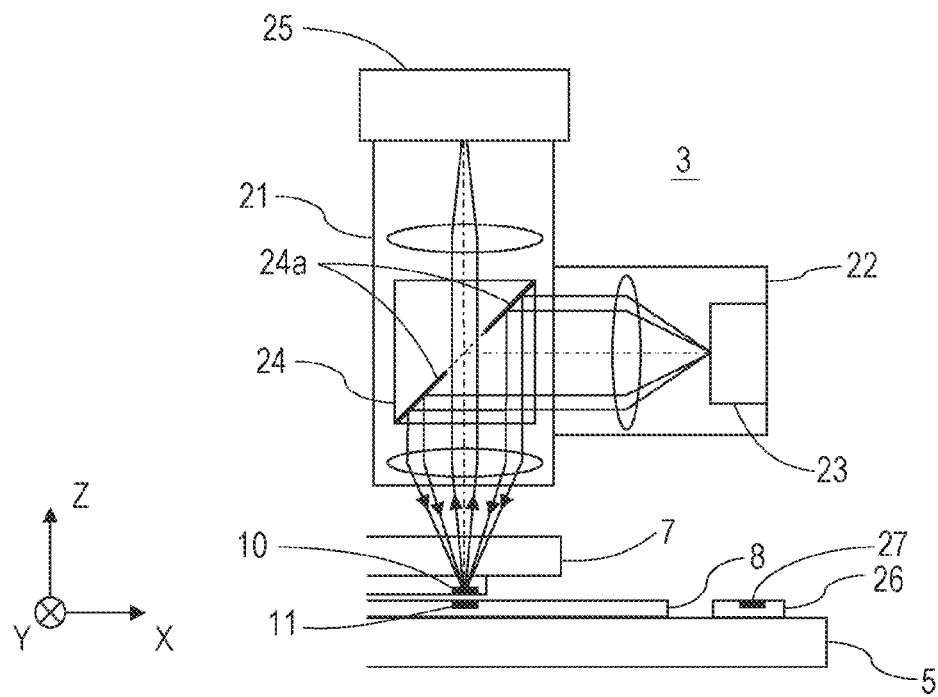
FIG. 2 is a drawing illustrating a detection apparatus of the first embodiment.

Subsequently, the mark 10 formed on the mold 7 and the mark 11 formed on the substrate 8 will be described. In addition, the detection apparatus 3 configured to detect the mark 10 and the mark 11 will be described. FIG. 2 illustrates an example of a configuration of the detection apparatus 3 configured to detect the alignment marks and provided in the imprint apparatus 1 of the first embodiment. The detection apparatus 3 includes a light source 23 configured to illuminate the alignment mark, and an image-pickup element 25 (detection apparatus) configured to pick up an image of the alignment mark irradiated with light and an image of the moire pattern. The detection apparatus 3 is also provided with a detection optical system 21 and an illumination optical system 22. The illumination optical system 22 includes an optical member such as a prism 24, and is configured to guide light from the light source 23 onto an optical axis which is the same as that of the detection optical system 21 by using the prism 24, and illuminates the mark 10 and the mark 11.

The light source 23 uses a halogen lamp or an LED, and is configured to irradiate an object with a visible light or an infrared ray. Light irradiated from the light source 23 does not include a UV beam which cures the imprint material 9. The detection optical system 21 and the illumination optical system 22 are configured to share part of the optical member which constitute parts of the detection optical system 21 and the illumination optical system 22, and the prism 24 is arranged on or in the vicinity of pupil planes of the detection optical system 21 and the illumination optical system 22.

The mark 10 and the mark 11 are composed of the grid patterns having pitches different from each other. The detection optical system 21 is configured to receive illumination of light from the light source 23 by the illumination optical system 22 and image the moire pattern (diffracted light) generated by light diffracted at the mark 10 and the mark 11 on the image-pickup element 25. A CCD or a CMOS are used as the image-pickup element 25.

Figure 3A:
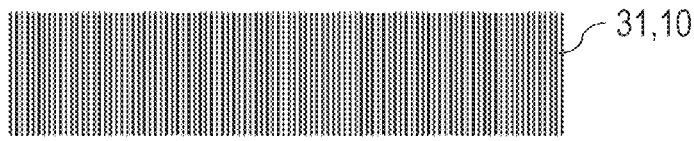
FIGS. 3A to 3D are drawings illustrating alignment marks generating moire patterns.
Figure 3B:
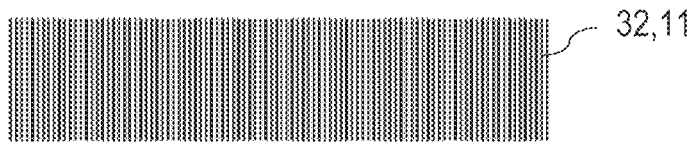
Figure 3C:
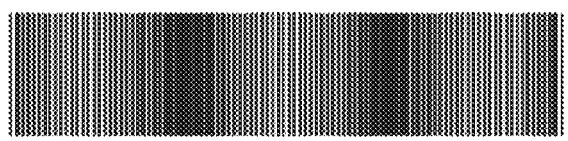
Figure 3D:
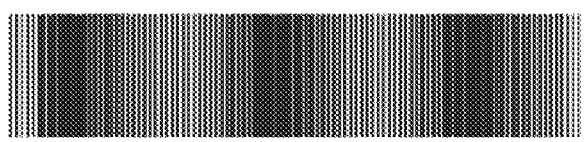

The principle of generation of the moire pattern and detection of the relative position between the mold 7 and the substrate 8 using the moire pattern will be described. If grid patterns 31 and 32 having grid pitches slightly different from each other as illustrated in FIG. 3A and FIG. 3B are overlapped, a moire pattern having a cycle which reflects the grid pitch difference as illustrated in FIG. 3C is generated by a diffracted light diffracted on the grid patterns 31 and 32. The moire pattern changes in position of bright portions and dark portions (phase of the moire pattern) in accordance with the relative position between the grid patterns 31 and 32. For example, one of the grid patterns 31 and 32 is slightly shifted, the moire pattern in FIG. 3C changes as illustrated in FIG. 3D. The moire pattern enlarges the actual amount of relative positional displacement between the grid patterns 31 and 32 and generates a stripe at large cycles. Therefore, even though the resolving power of the detection optical system 21 is low, the relationship of the relative position between the two objects may be measured with high degree of accuracy.

Therefore, in the imprint apparatus of the first embodiment, the grid pattern 31 is used as the mark 10 formed on the mold 7, and an image of the moire pattern is picked up by using the mark 11 formed on the substrate 8, so that the relative alignment between the mold 7 and the substrate 8 is achieved. The resolving power of the detection optical system 21 of the detection apparatus 3 is assumed not to be able to resolve the grid patterns 31 and 32, but is assumed to be sufficient for resolving the moire pattern.

If an attempt is made to detect the grid patterns 31 and 32 in a bright field (illuminated from a perpendicular direction and detect a diffracted light from the perpendicular direction) in order to detect the moire pattern (diffracted light), the detection apparatus 3 detects a 0 order diffracted light from the grid patterns 31 and 32. The 0 order diffracted light from one of the grid patterns 31 and 32 causes lowering of contrast of the moire pattern.

Figure 4A:
FIGS. 4A and 4B are drawings illustrating the alignment marks of the first embodiment.
Figure 4B:
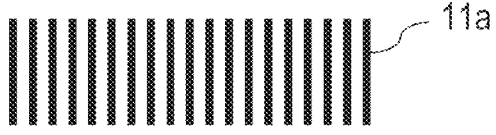

Therefore, the detection apparatus 3 of the first embodiment has a configuration of a dark field in which the 0 order diffracted light is not detected by illuminating the mark 10 and the mark 11 in an oblique incidence. In order to achieve a detection of the moire pattern with the configuration of the dark field illuminating in the oblique incidence, one of the mark 10 on the mold side and the mark 11 on the substrate side employs a grid pattern like a checker board as illustrated in FIG. 4A, and the other one of those employs a grid pattern as illustrated in FIG. 4B. Here, a mark 10a on the mold side employs the grid pattern like the checker board, and a mark 11a on the substrate side employs the grid pattern as illustrated in FIG. 4B. The mark 10a on the mold side includes a grid pattern having grid pitches in the measuring direction (X direction) and in a direction orthogonal to the measuring direction (non-measuring direction (Y direction)), and the mark on the substrate side includes a grid pattern having grid pitches in the measuring direction. Light from the illumination optical system 22 is inclined from the direction perpendicular to the mold and the substrate in the non-measuring direction to illuminates the mark. The light incident on the mark in the oblique incidence is diffracted in the non-measuring direction by the grid pattern like the checker board arranged on the substrate side, and the detection optical system 21 is arranged so as to detect only diffracted light of a specific order other than the 0 order in the non-measuring direction.

The cycle of the moire patterns detected from the grid pattern is the same irrespective of whether the grid pattern like the checker board is employed on the mold side or the substrate side. If the moire pattern formed in the grid pattern described in conjunction with FIGS. 3A to 3D and the grid pitch difference in the measuring direction (X direction) of the grid pattern illustrated in FIG. 4A and FIG. 4B is the same as the grid pitch difference of the grid patterns in FIG. 3A and FIG. 3B, the cycle of the moire patterns are the same.

Reference Plate

An evaluation of an optical performance of the detection apparatus 3 using a reference plate 26 arranged on the substrate stage 5 will be described. As illustrated in FIG. 1, the imprint apparatus 1 is provided with the reference plate 26 having a reference mark 27 formed thereon arranged on the substrate stage 5. The member of the reference plate 26 is formed, for example, of glass, and is provided with the reference mark 27 with a chrome film on a surface of the reference plate 26.

Figure 5:
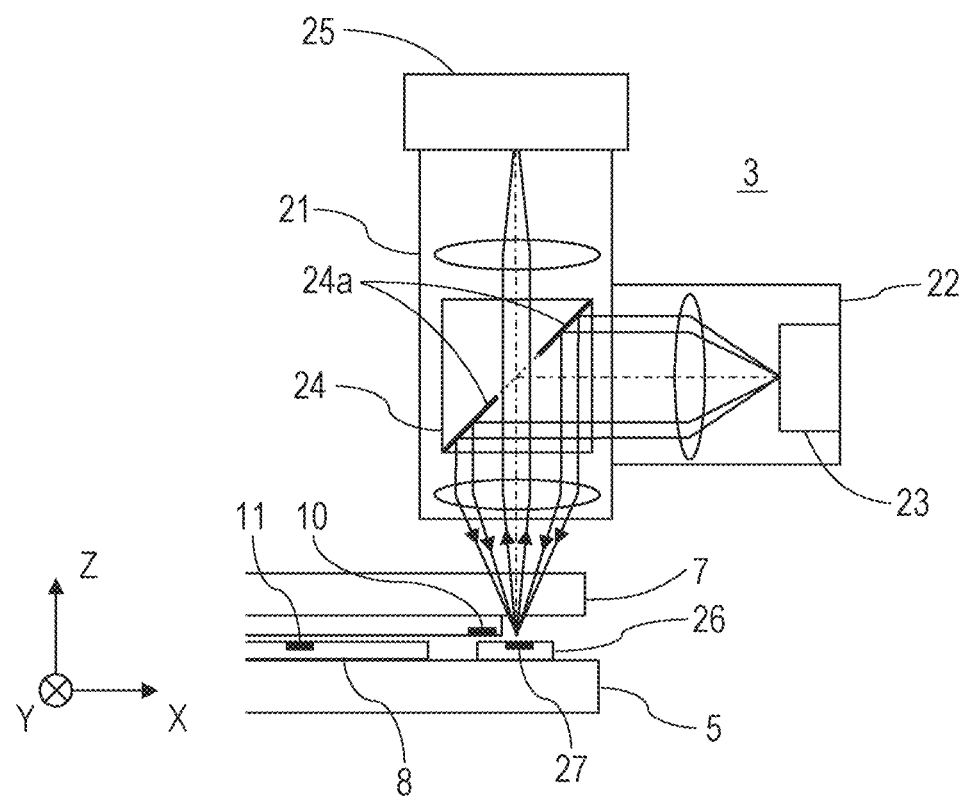
FIG. 5 is a drawing illustrating a state of detecting the mark with the detection apparatus of the first embodiment.

FIG. 5 illustrates an arrangement of the detection apparatus 3, the mold 7, and the reference plate 26 when the detection apparatus 3 of the first embodiment detects the reference mark 27. The control unit CNT moves the substrate stage 5 in the X direction and the Y direction so that the reference plate 26 is arranged under the mold 7. The detection apparatus 3 is driven in the X direction and the Y direction so as to detect the reference mark 27 without the intermediary of the patterned surface 7a on the outside of the patterned surface 7a of the mold 7. The detection apparatus 3 in this case may also be driven in the Z direction for focusing the optical system on the position of the reference mark 27. The detection apparatus 3 illuminates the reference mark 27 in the oblique incidence, and detects scattered light from the reference mark 27 in the dark field, whereby an image of the reference mark 27 is formed on the image-pickup element 25. The mark image is preferably a sine-wave signal like the moire patterns formed by the marks 10 and 11 on the mold 7 and the substrate 8 in conducting optical performance evaluation of the detection apparatus 3.

Reference Mark

Figure 6A:
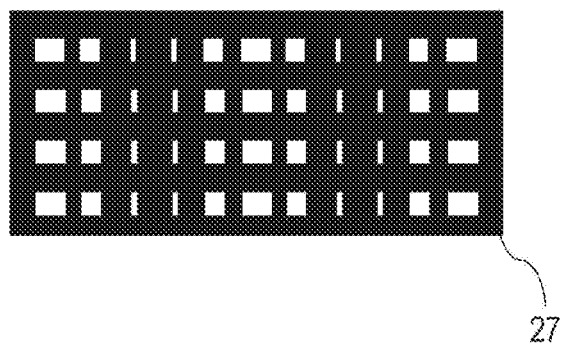
FIGS. 6A and 6B are drawings illustrating a reference mark and an image to be detected by a position detecting system of the first embodiment.
Figure 6A:
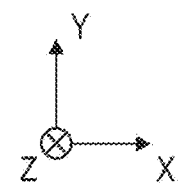

The reference mark 27 configured to generate the sine-wave signal will be described in detail. As illustrated in FIG. 6A, the reference mark 27 of the first embodiment is formed by the presence and absence of the chrome film on a glass surface and, for example, the chrome film is formed in a void area. The reference mark 27 illustrated in FIG. 6A includes a plurality of linear patterns. The plurality of linear patterns included in the reference mark 27 are arranged in the measuring direction (X direction). A line width of the linear patterns in the measuring direction and a distance (pitch) between the lines are changed in the a sinusoidal wave pattern in the duty ratio of the line width and the distance between the lines (pitches) so as not to be higher than the resolving power of the detection optical system 21 of the detection apparatus 3. Shown here are the pitches of the linear patterns being set to be constant, and the line width being changed in the sinusoidal wave pattern. In this configuration, the ratio of the line width with respect to the pitch of the linear pattern is changed in the sinusoidal wave pattern.

Figure 6B:
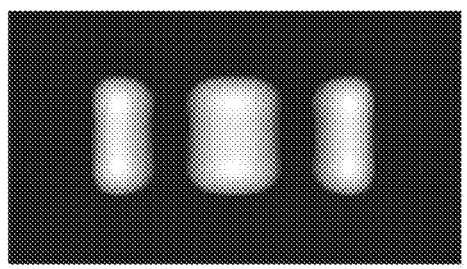

FIG. 6B illustrates an image of the reference mark 27 picked up on the image-pickup element 25 of the detection apparatus 3. Since the reference mark 27 is a pattern not higher than the resolving power of the detection optical system 21 of the detection apparatus 3, the lines of the pattern are not resolved as illustrated in FIG. 6B, and the image of the reference mark 27 picked up by the image-pickup element 25 is blurred. The image picked up by the image-pickup element 25 is an image having a change in brightness and darkness so as to follow the change in the duty ratio between the line width and the pitches changed in the sinusoidal wave pattern. The image having changed in the brightness and the darkness is detected as a sine-wave signal in the same manner as in the moire pattern.

The control unit CNT may obtain the cycle of the sine-wave signal (detection signal) by using the image of the reference mark 27 picked up by the image-pickup element 25. With the cycle in which the duty ratio between the line width and the pitches of the reference mark 27 is changed in the sinusoidal wave pattern, the cycle of the sine-wave signal of the reference mark 27 picked up by the image-pickup element 25 is determined. Therefore, from the cycle of the sine-wave signal of the image of the reference mark 27 actually formed on the image-pickup element 25 of the detection apparatus 3, the control unit CNT may evaluate the optical magnification, which is one of the optical performances of the detection apparatus 3. Here, the magnification of the detection optical system 21 (imaging optical system) of the detection apparatus 3 may be evaluated. In addition, the sinusoidal wave signal generated by the reference mark 27 is picked up by the image-pickup element 25 by a plurality of times, and a measurement repeatability, which is one of the optical performances of the detection apparatus 3, may be evaluated from variations in phase of the sine-wave signal.

In this manner, by detecting the reference mark 27 described above with the detection apparatus 3, optical performances of the detection apparatus 3 may be evaluated without using the mold 7 and the substrate 8.

Second Embodiment

Reference Mark

The reference mark 27 configured to generate the sine-wave signal of another embodiment will be described. The reference mark 27 detected by the detection apparatus 3 of a second embodiment will be described in detail with reference to FIGS. 7A and 7B. Configurations of the imprint apparatus 1 and the detection apparatus 3 other than the reference mark 27 are the same as those in the first embodiment, and hence description will be omitted.

Figure 7A:
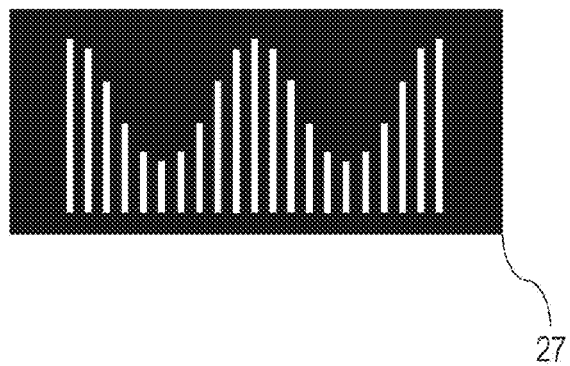
FIGS. 7A and 7B are drawings illustrating a reference mark and an image to be detected by the position detecting system of a second embodiment.
Figure 7A:
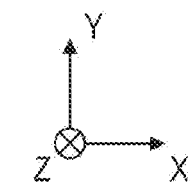

As illustrated in FIG. 7A, the reference mark 27 of the second embodiment is formed by the presence and absence of the chrome film on the glass surface and the chrome film is formed in the void area in the same manner as the first embodiment. The reference mark 27 illustrated in FIG. 7A includes a plurality of linear patterns. The plurality of linear patterns included in the reference mark 27 are arranged in the measuring direction (X direction). A line width of the linear patterns in the measuring direction and a distance (pitch) between the lines are not higher than the resolving power of the detection optical system 21 of the detection apparatus 3. In the reference mark 27 of the second embodiment, the length of the linear patterns in the non-measuring direction (Y direction) is changed in the sinusoidal pattern. Shown here are the pitches of the linear patterns being set to be constant, and the length in the non-measuring direction being changed in the sinusoidal wave pattern.

Figure 7B:
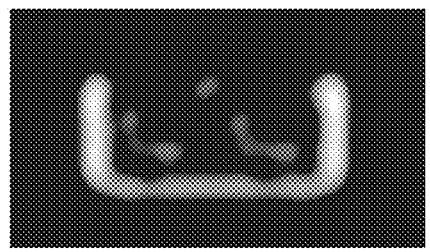

FIG. 7B illustrates an image of the reference mark 27 picked up on the image-pickup element 25 of the detection apparatus 3. The reference mark 27 illustrated in FIG. 7A is a mark not higher than the resolving power of the detection optical system 21 of the detection apparatus 3. Therefore, in the image on the image-pickup element 25 of the detection apparatus 3, the lines of the mark are blurred without being resolved as illustrated in FIG. 7B, and becomes an image having a change in brightness and darkness following the change in the length in the non-measuring direction changed in the sinusoidal wave pattern. By integrating this image in the non-measuring direction by the image-pickup element 25, the image with the change in brightness and darkness in the sinusoidal wave pattern is formed, and the sinusoidal wave signal like the moire pattern is emitted.

The control unit CNT may obtain the cycle of the sine-wave signal (detection signal) by using the image of the reference mark 27 picked up by the image-pickup element 25. The cycle of the sine-wave signal generated by the reference mark 27 is determined by the cycle in which the length of the reference mark 27 in the non-measuring direction is changed in the sine-wave signal. The control unit CNT may evaluate the optical magnification, which is one of the optical performances of the detection optical system 21 of the detection apparatus 3, from the cycle of the image of the sine-wave signal actually picked up by the image-pickup element 25 of the detection apparatus 3. By detecting the sine-wave signal generated by the reference mark 27 by a plurality of times by using the image-pickup element 25, the measurement repeatability, which is one of the optical performances of the detection apparatus 3, may be evaluated from variations in phase of the sine-wave signal.

In this manner, by detecting the reference mark 27 described above with the detection apparatus 3, optical performances of the detection apparatus 3 may be evaluated without using the mold 7 and the substrate 8.

Other Matters

Although the reference mark 27 formed on the reference plate 26 has been used for description in any of the embodiments described above, the place where the reference mark 27 is formed is not limited thereto. For example, the reference mark 27 may be provided directly on the substrate stage 5. The reference mark 27 may be formed on the substrate. The substrate on which the reference mark 27 is formed may be retained instead of the substrate 8 before the substrate stage 5 retains the substrate 8. The detection apparatus 3 detects the reference mark 27 formed on the substrate so that the detection apparatus 3 is evaluated. The imprinting process may be performed by discharging out the substrate having the reference mark 27 formed thereon from the imprint apparatus after the evaluation has been performed, and loading the substrate 8 for forming the pattern.

Although the reference mark 27 is detected without the intermediary of the patterned surface 7a of the mold 7 when detecting the reference mark 27 with the detection apparatus 3 in any of the embodiments described above, the reference mark 27 may be detected with the intermediary of an area having no pattern even the area is within the pattern surface 7a. In a state in which the mold 7 is not retained by the mold retaining portion 4, the detection apparatus 3 may detect the reference mark 27. In other words, the detection apparatus 3 may detect the reference mark without the intermediary of the mold 7, and in that case, the optical performance of the detection apparatus 3 may be evaluated without using both of the mold 7 and the substrate 8.

Although the case where the detection apparatus 3 detects the mark with the dark field illumination has been described in any of the embodiments described above, the mark may be detected by the bright field illumination.

Although the UV cured resin is used as the imprint material for description in any of the embodiments described above, a light cured resin other than the UV cured resin may be used, and the imprint material is selected as needed depending on the type of the semiconductor device. Therefore, the wavelength of light irradiated from the irradiating portion 2 is also selected as needed in accordance with the type of the light cured resin to be supplied onto the substrate.

Method of Manufacturing Articles

A method of manufacturing articles will be described. The method of manufacturing the device (semiconductor integrated circuit element, liquid crystal display element, and the like) as the articles includes a process of forming a pattern on a substrate (wafer, glass plate, film-form substrate) by using the above-described imprint apparatus. Furthermore, the manufacturing method described above may include a process of etching the substrate on which a pattern is formed. In a case of manufacturing other articles such as a patterned media (recording media) or optical devices, the manufacturing method may include other processes which machine the substrate on which the pattern is formed instead of etching. The method of manufacturing articles of this disclosure is advantageous in terms of at least one of performance, quality, productivity, and production cost of the articles in comparison with the method of the related art.

Although the preferred embodiments of this disclosure have been described thus far, this disclosure is not limited to those embodiments, and various modifications or variations may be made within the scope of this disclosure.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-028867, filed Feb. 18, 2014 which is hereby incorporated by reference herein in its entirety.

What is claimed is:

1. A detection apparatus configured to detect a moire pattern generated by grid patterns having grid pitches different from each other, the detection apparatus comprising:
   an image-pickup unit configured to pick up an image of the moire pattern;
   an imaging optical system configured to form the image of the moire pattern on the image-pickup unit;
   a processing unit configured to process an image-pickup result of the moire pattern picked up by the image-pickup unit; and
   a reference mark, disposed on a member, which has a plurality of pattern elements periodically arranged in a first direction,
   wherein none of the pattern elements have widths larger than a resolving power of the imaging optical system in the first direction,
   wherein the widths of the pattern elements and intervals between the pattern elements in the first direction vary in the first direction,
   wherein the reference mark is different from the grid patterns and is for evaluating the detection apparatus by an image of the reference mark alone,
   wherein the imaging optical system picks up the image of the reference mark alone.

2. The detection apparatus according to claim 1, wherein the widths of the pattern elements and intervals between the pattern elements in the first direction change in a sinusoidal wave pattern in the first direction.

3. The detection apparatus according to claim 1, wherein the processing unit obtains a position of the reference mark in the first direction by processing the image-pickup result of the reference mark picked up by the image-pickup unit.

4. A detection apparatus configured to detect a moire pattern generated by grid patterns having grid pitches different from each other, the detection apparatus comprising:

an image-pickup unit configured to pick up an image of the moire pattern;

an imaging optical system configured to form the image of the moire pattern on the image-pickup unit;

a processing unit configured to process an image-pickup result of the moire pattern picked up by the image-pickup unit; and a reference mark, disposed on a member, which has a plurality of pattern elements periodically arranged in a first direction, wherein none of the pattern elements have widths larger than a resolving power of the imaging optical system in the first direction, wherein lengths in a second direction perpendicular to the first direction of the pattern elements change in the first direction, wherein the reference mark is different from the grid patterns and is for evaluating the detection apparatus by an image of the reference mark alone, wherein the imaging optical system picks up the image of the reference mark alone.

5. The detection apparatus according to claim 4, wherein lengths in the second direction of the pattern elements change in the sinusoidal wave pattern in the first direction.

6. The detection apparatus according to claim 4, wherein the processing unit integrates the image of the reference mark picked up by the image-pickup unit in the second direction and evaluates the detection apparatus using a signal obtained by the integration.

7. The detection apparatus according to claim 4, wherein the processing unit obtains a position of the reference mark in the first direction by processing the image-pickup result of the reference mark picked up by the image-pickup unit.

8. The detection apparatus according to claim 1, wherein the processing unit obtains a magnification of the imaging optical system of the detection apparatus, or a measurement repeatability of the detection apparatus by processing the image-pickup result of the reference mark picked up by the image-pickup unit.

9. An alignment apparatus configured to perform alignment of two different devices under test by detecting moire patterns generated by overlapping grid patterns formed on the two different devices under test respectively, comprising:

a drive mechanism configured to align the two different devices under test on the basis of the result of detection of the detection apparatus, and a detection apparatus according to claim 1.

10. An imprint apparatus configured to form a pattern on an imprint material supplied onto a substrate by using a mold having a pattern formed thereon, comprising:

a detection apparatus configured to detect a moire pattern generated by a grid pattern formed on the mold and a grid pattern formed on the substrate and having grid pitches different from that of the grid pattern formed on the mold, wherein the detection apparatus is the detection apparatus according to claim 1.

11. An imprint apparatus configured to form a pattern on an imprint material supplied onto a substrate by using a mold having a pattern formed thereon, comprising:

a detection apparatus configured to detect a moire pattern generated by a grid pattern formed on the mold and a grid pattern formed on the substrate and having grid pitches different from that of the grid pattern formed on the mold, wherein the detection apparatus is the detection apparatus according to claim 4.

12. The imprint apparatus according to claim 10, comprising:

a substrate stage configured to retain the substrate, wherein the member is provided on the substrate stage.

13. A method of manufacturing an article comprising:

forming a pattern on a substrate by using an imprint apparatus: and processing the substrate having the pattern formed thereon in the process of forming the pattern, wherein the imprint apparatus is configured to form a pattern on an imprint material supplied onto a substrate by using a mold having a pattern formed thereon, the imprinting apparatus including:

a detection apparatus configured to detect a moire pattern generated by a grid pattern formed on the mold and a grid pattern formed on the substrate and having grid pitches different from that of the grid pattern formed on the mold, wherein the detection apparatus is the detection apparatus according to claim 1.

14. The detection apparatus according to claim 1, wherein the processing unit evaluates the detection apparatus by processing the image-pickup result of the reference mark picked up by the image-pickup unit.

15. The detection apparatus according to claim 4, wherein the processing unit evaluates the detection apparatus by processing the image-pickup result of the reference mark picked up by the image-pickup unit.

16. The detection apparatus according to claim 4, wherein the processing unit obtains a magnification of the imaging optical system of the detection apparatus, or a measurement repeatability of the detection apparatus by processing the image-pickup result of the reference mark picked up by the image-pickup unit.

17. An alignment apparatus configured to perform alignment of two different devices under test by detecting moire patterns generated by overlapping grid patterns formed on the two different devices under test respectively, comprising:

a drive mechanism configured to align the two different devices under test on the basis of the result of detection of the detection apparatus, and a detection apparatus according to claim 4.

18. The imprint apparatus according to claim 11, comprising:

a substrate stage configured to retain the substrate, wherein the member is provided on the substrate stage.

19. A method of manufacturing an article comprising:

forming a pattern on a substrate by using an imprint apparatus; and processing the substrate having the pattern formed thereon in the process of forming the pattern, wherein the imprint apparatus is configured to form a pattern on an imprint material supplied onto a substrate by using a mold having a pattern formed thereon, the imprinting apparatus including:

a detection apparatus configured to detect a moire pattern generated by a grid pattern formed on the mold and a grid pattern formed on the substrate and having grid pitches different from that of the grid pattern formed on the mold, wherein the detection apparatus is the detection apparatus according to claim 4.

* * * * *